US012571123B2

(12) United States Patent (10) Patent No.: US 12,571,123 B2
Mikawa et al. (45) Date of Patent: Mar. 10, 2026

(54) GALLIUM NITRIDE CRYSTAL, GALLIUM NITRIDE SUBSTRATE, AND METHOD FOR PRODUCING GALLIUM NITRIDE SUBSTRATE

(71) Applicants: MITSUBISHI CHEMICAL CORPORATION, Tokyo (JP); THE JAPAN STEEL WORKS, LTD., Tokyo (JP); TOHOKU UNIVERSITY, Sendai (JP)

(72) Inventors: Yutaka Mikawa, Tokyo (JP); Hirotaka Ikeda, Tokyo (JP); Quanxi Bao, Tokyo (JP); Kouhei Kurimoto, Tokyo (JP); Kohei Shima, Sendai (JP); Kazunobu Kojima, Sendai (JP); Toru Ishiguro, Sendai (JP); Shigefusa Chichibu, Sendai (JP)

(73) Assignees: MITSUBISHI CHEMICAL CORPORATION;, Tokyo (JP); THE JAPAN STEEL WORKS, LTD., Tokyo (JP); Tohoku University, Sendai (JP)

( * ) Notice: Subject to any disclaimer, the term of this patent is extended or adjusted under 35 U.S.C. 154(b) by 301 days.

(21) Appl. No.: 18/237,496

(22) Filed: Aug. 24, 2023

(65) Prior Publication Data

US 2023/0392280 A1    Dec. 7, 2023

Related U.S. Application Data

(63) Continuation of application No. PCT/JP2022/007819, filed on Feb. 25, 2022.

(30) Foreign Application Priority Data

Feb. 25, 2021    (JP) .................................. 2021-028912
Mar. 15, 2021    (JP) .................................. 2021-040961

(51) Int. Cl.
*H01L 21/02*        (2006.01)
*C30B 7/10*        (2006.01)
(Continued)

(52) U.S. Cl.
CPC ............ *C30B 7/105* (2013.01); *C30B 29/406* (2013.01); *H01L 21/02389* (2013.01);
(Continued)

(58) Field of Classification Search
CPC . C30B 7/105; C30B 29/406; H01L 21/02389; H01L 21/02005; H01L 21/0242;
(Continued)

(56) References Cited

U.S. PATENT DOCUMENTS 7,303,630 B2 *  12/2007  Motoki .................. C30B 29/40
                                                     257/101
2011/0268645 A1    11/2011  Mikawa et al.
(Continued)

FOREIGN PATENT DOCUMENTS

JP        2003277182 A    10/2003
JP        2005008444 A    1/2005
(Continued)

OTHER PUBLICATIONS

English translation of the International Preliminary Report on Patentability and Written Opinion issued Aug. 29, 2023 in. PCT/JP2022/007819, 4 pages.
(Continued)

*Primary Examiner* — David Vu
(74) *Attorney, Agent, or Firm* — Element IP, PLC

(57) ABSTRACT

An object of the present invention is to provide a GaN crystal long in light emission lifetime by time-resolved photoluminescence measurement and provide high-quality GaN crystal and GaN substrate that have few specified crystal defects affecting the light emission lifetime. A gal-
(Continued)

lium nitride crystal having a light emission lifetime by time-resolved photoluminescence measurement, of 5 ps or more and 200 ps or less, and satisfying at least one of the following requirement (i) and requirement (ii): (i) an FWHM in a 004 diffraction X-ray rocking curve is 50 arcsec or less at least one position of the crystal; and (ii) a dislocation density is $5\times10^6$ cm$^{-2}$ or less.

10 Claims, 4 Drawing Sheets

(51) Int. Cl.

| | | |
|---|---|---|
| *C30B 29/40* | (2006.01) | |
| *H10H 20/01* | (2025.01) | |
| *H10H 20/818* | (2025.01) | |
| *H10H 20/825* | (2025.01) | |

(52) U.S. Cl.
CPC ...... *H10H 20/0137* (2025.01); *H10H 20/818* (2025.01); *H10H 20/825* (2025.01)

(58) Field of Classification Search
CPC ........... H01L 21/02458; H01L 21/0254; H01L 21/02625; H01L 21/02628; H01L 21/02107; H10H 20/0137; H10H 20/818; H10H 20/825; B28D 5/0005
See application file for complete search history.

(56) References Cited

U.S. PATENT DOCUMENTS

| | | | |
|---|---|---|---|
| 2013/0011677 A1 | 1/2013 | Nambu et al. | |
| 2015/0361587 A1 | 12/2015 | Mikawa et al. | |
| 2017/0204534 A1 | 7/2017 | Hayashi et al. | |
| 2019/0189438 A1 | 6/2019 | Mikawa et al. | |
| 2021/0164127 A1 | 6/2021 | Iso et al. | |

FOREIGN PATENT DOCUMENTS

| | | |
|---|---|---|
| JP | 2011068545 A | 4/2011 |
| JP | 2015040170 A | 3/2015 |
| JP | 2019210210 A | 12/2019 |
| TW | I234293 B | 6/2005 |
| TW | 200625410 A | 7/2006 |
| TW | 201435164 A | 9/2014 |
| WO | WO-2020036047 A1 | 2/2020 |

OTHER PUBLICATIONS

Izumi, T., et al., "Time-resolved photoluminescence spectroscopy in GaN-based semiconductors with micron spatial. resolution", Journal of Luminescence, 2000, vol. 87-89, pp. 1196-1198.
English translation of the International Search Report issued Apr. 26, 2022 in PCT/JP2022/007819, 2 pages.
Extended European Search Report issued Jul. 1, 2024, in corresponding European Patent Application No. 22759789.5, 11 pages.
Office Action issued Nov. 26, 2025, in corresponding Korean Patent Application No. 10-2023-7032224 (with machine English translation), 17 pages.
Combined Taiwanese Office Action and Search Report issued Jan. 8, 2026, in corresponding Taiwanese Patent Application No. 111106948 (with English translation), 10 pages.

* cited by examiner

1

GALLIUM NITRIDE CRYSTAL, GALLIUM NITRIDE SUBSTRATE, AND METHOD FOR PRODUCING GALLIUM NITRIDE SUBSTRATE

CROSS-REFERENCE TO RELATED APPLICATION

This is a continuation of International Application PCT/JP2022/007819, filed on Feb. 25, 2022, and designated the U.S., and claims priority from Japanese Patent Application 2021-028912 which was filed on Feb. 25, 2021, and Japanese Patent Application 2021-040961 which was filed on Mar. 15, 2021, the entire contents of which are incorporated herein by reference.

TECHNICAL FIELD

The present invention mainly relates to a gallium nitride crystal.

BACKGROUND ART

Gallium nitride (GaN) crystals, because of having large band gaps and exhibiting interband transition of direct transition type, have been conventionally used as semiconductor materials and used for various semiconductor devices, for example, ultraviolet and blue light-emitting diodes, relatively short-wavelength light-emitting elements such as semiconductor laser, electronic elements, and semiconductor sensors.

GaN crystals have been recently used for not only light-emitting device applications, but also power semiconductor elements (power devices) and high-frequency power devices. Thus, development of GaN crystals that can withstand high voltages and large currents has been advanced.

These devices are preferably produced from high-quality semiconductor substrates (self-supporting substrates) that include the same types of materials and contain less crystal defects, and techniques for producing GaN crystals that can be formed into such semiconductor substrates are actively studied.

Examples of known methods for producing GaN crystals include liquid phase growth methods such as an ammonothermal method and vapor phase epitaxy methods such as a hydride vapor phase epitaxy method (HVPE method).

An HVPE method is a method involving introducing Ga chloride and $NH_3$ in hydrogen stream into a furnace to pyrolyze them, and depositing a crystal generated by such pyrolysis, on a substrate.

On the other hand, an ammonothermal method is a method for producing a desired crystal material by means of dissolution-precipitation reaction of a nitrogen-containing solvent such as ammonia in a supercritical state and/or a subcritical state, and a raw material. In the case of application to crystal growth, the temperature dependence of raw material solubility in a nitrogen-containing solvent such as ammonia is utilized to generate a supersaturated state by the temperature difference, thereby precipitating a crystal. Specifically, a crystal can be produced by placing and sealing a crystal raw material or a seed crystal in a pressure-resistant vessel such as an autoclave, performing heating with a heater or the like to thereby form a high-temperature zone and a low-temperature zone in the pressure-resistant vessel, and dissolving a raw material in one zone thereof and growing a crystal in other zone thereof (see, for example, Patent Documents 1 to 3).

An ammonothermal method has the advantages of being good in raw material usage efficiency and allowing for suppression of production cost, as compared with an HVPE method. An ammonothermal method has been recently progressively put to practical use because of enabling an increase in quality and an increase in diameter of a GaN crystal.

RELATED ART DOCUMENT

Patent Document

Patent Document 1: JP 2003-277182 A
Patent Document 2: JP 2005-8444 A
Patent Document 3: JP 2011-68545 A

SUMMARY OF THE INVENTION

Problems to be Solved by the Invention

As described above, crystal growth of GaN by an ammonothermal method has the advantages of suppression of production cost, and an increase in quality and an increase in diameter of a crystal. On the other hand, it has been found according to studies by the present inventors that a GaN crystal obtained by an ammonothermal method has a relatively shorter light emission lifetime by time-resolved photoluminescence (TRPL) measurement than a GaN crystal obtained by an HVPE method. Thus, such a GaN crystal obtained by an ammonothermal method has been presumed to contain many specified crystal defects or impurities, and as a result, has been feared to potentially affect the production of a semiconductor device excellent in function.

The present invention has been progressively studied in order to provide a GaN crystal long in light emission lifetime by TRPL measurement and provide high-quality GaN crystal and GaN substrate that have few specified crystal defects affecting the light emission lifetime.

Means for Solving the Problems

The present inventors have made intensive studies in order to solve the above problems, and as a result, have found that the above problems can be solved by suppressing generation of point defects in a GaN crystal, leading to the completion of the present invention.

An embodiment of the present invention encompasses the following, but not limited thereto.

[1] A gallium nitride crystal having a light emission lifetime by time-resolved photoluminescence measurement, of 5 ps or more and 200 ps or less, and satisfying at least one of the following requirement (i) and requirement (ii):

(i) an FWHM in a 004 diffraction X-ray rocking curve is 50 arcsec or less at least one position of the crystal; and (ii) a dislocation density is $5 \times 10^6$ cm$^{-2}$ or less.

[2] The gallium nitride crystal according to [1], wherein the dislocation density is less than $1 \times 10^6$ cm$^{-2}$.

[3] The gallium nitride crystal according to [1] or [2], wherein a hydrogen concentration is $2 \times 10^{19}$ atoms/cm$^3$ or less.

[4] The gallium nitride crystal according to any of [1] to [3], wherein an oxygen concentration is $2 \times 10^{19}$ atoms/cm$^3$ or less.

[5] A gallium nitride substrate obtained by slicing the gallium nitride crystal according to any of [1] to [4].

[6] A method for producing a gallium nitride substrate, the method comprising a step of performing selection so as to cut out a region where a light emission lifetime by time-resolved photoluminescence measurement is 5 ps or more and 200 ps or less, and slicing the gallium nitride crystal according to any of [1] to [4].

[7] A gallium nitride substrate obtained by the production method according to [6], wherein the light emission lifetime by time-resolved photoluminescence measurement is 5 ps or more and 200 ps or less in a region corresponding to 90% or more of a surface of the substrate.

[8] The gallium nitride substrate according to [7], wherein a difference in light emission lifetime at each measurement point is 30 ps or less in time-resolved photoluminescence measurement of a main surface of the substrate at two or more different points.

[9] The gallium nitride substrate according to [7], having at least two points where a difference in light emission lifetime at each measurement point is 1 ps or more in time-resolved photoluminescence measurement of a main surface of the substrate.

[10] A method for producing a gallium nitride substrate, the method comprising a step of growing a gallium nitride crystal having a thickness of 500 μm or more on a gallium nitride seed, by an ammonothermal method, and cutting out the gallium nitride crystal grown, to a plate shape, to produce a gallium nitride substrate, wherein the gallium nitride substrate has a light emission lifetime by time-resolved photoluminescence measurement, of 5 ps or more and 200 ps or less.

Effects of the Invention

According to the present invention, high-quality GaN crystal and GaN substrate can be provided, in which specified crystal defects often found in a GaN crystal obtained by an ammonothermal method are decreased.

MODE FOR CARRYING OUT THE INVENTION

Figure 1:
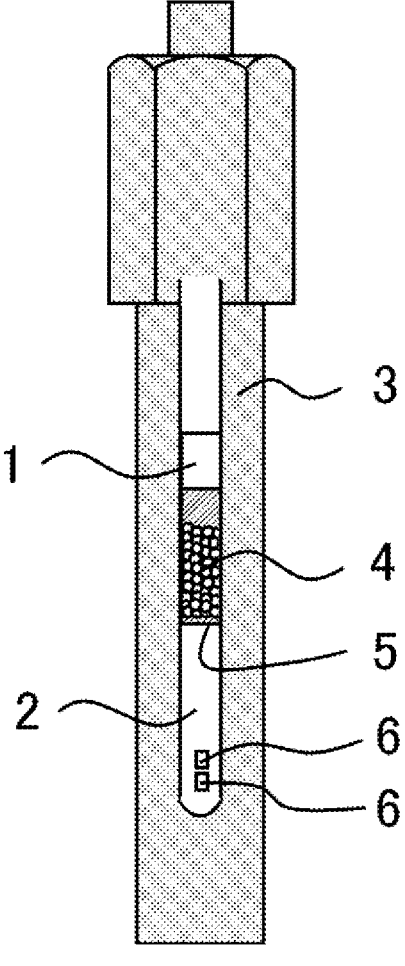
FIG. 1 is a schematic view of a crystal production apparatus usable in an embodiment of the present invention.

In the gallium nitride crystal, the (0001) crystal plane and the (000-1) crystal plane are collectively referred to as "c-plane", the {10-10} crystal plane is referred to as "m-plane", and the {11-20} crystal plane is referred to as "a-plane". The crystal axis perpendicular to the c-plane is called "c-axis", the crystal axis perpendicular to the m-plane is called "m-axis", and the crystal axis perpendicular to the a-plane is called "a-axis" When a crystal axis, a crystal plane, a crystal orientation, and the like are herein mentioned, a crystal axis, a crystal plane, a crystal orientation, and the like of the GaN crystal are meant unless especially noted.

A hexagonal Miller index (hkil) satisfies a relationship of h+k=i, and thus may also be designated as (hkl) displayed with three digits. For example, (0002), if displayed with three digits, is designated as (002).

The (0001) crystal plane and the (000-1) crystal plane may be herein collectively designated as "(000±1) crystal plane" for convenience. In the drawings, the [0001] direction is designated as "+c direction" and the [000-1] direction is designated "−c direction".

Hereinafter, gallium nitride according to an embodiment of the present invention, a production method thereof, and a crystal production apparatus and a member to be used in a production of the gallium nitride will be described in detail. The following constituent requirements may be described based on representative embodiments of the present invention, but the present invention is not limited to such embodiments. A numerical value range represented with "to" herein means a range including numerical values described before and after "to", as a lower limit value and an upper limit value.

<Gallium Nitride Crystal>

A gallium nitride (GaN) crystal according to an embodiment of the present invention (hereinafter, also simply referred to as "GaN crystal".) is a gallium nitride crystal having a light emission lifetime by time-resolved photoluminescence (TRPL) measurement (hereinafter, also referred to as "PL lifetime".), of 5 ps or more and 200 ps or less, and satisfying at least one of the following requirement (i) and requirement (ii):

(i) the FWHM in the 004 diffraction X-ray rocking curve is 50 arcsec or less at least one position of the crystal; and (ii) the dislocation density is $5 \times 10^6$ cm$^{-2}$ or less.

The GaN crystal, having a light emission lifetime by TRPL measurement, of 5 ps or more and 200 ps or less, specifically means that the crystal at least contains therein a position where the light emission lifetime is 5 ps or more and 200 ps or less.

The shape of the GaN crystal is not especially limited and may be an amorphous bulk shape or a plate shape, and, in the case of a plate shape, the surface shape may be, for example, a circular shape, or a polygonal shape such as a tetragonal shape, a hexagonal shape, or an octagon shape. The GaN crystal is preferably a single crystal of GaN.

Hereinafter, while the structure and properties will be described with, as an example, a GaN crystal having a plate shape whose surface shape is a circular shape, the description can also be applied to any other shape as long as it can be applied.

The thickness of the GaN crystal is not particularly limited, and can be, for example, 100 μm or more, 150 μm or more, 250 μm or more, 300 μm or more, 400 μm or more, 500 μm or more, 750 μm or more, 1 mm or more, or 2 mm or more, and can be, for example, less than 5 mm, less than 2 mm, less than 1 mm, less than 750 μm, less than 500 μm, less than 400 μm, less than 300 μm, or less than 250 μm. The thickness, while having particularly no upper limit, is usually 20 mm or less. In a case where the GaN crystal has an amorphous bulk shape, such a numerical value range is preferably satisfied in the growth direction of the crystal.

The diameter of a main surface of the GaN crystal is not particularly limited, and is typically, for example, 45 to 55 mm (about 2 inches), 95 to 105 mm (about 4 inches), 145 to 155 mm (about 6 inches), 195 to 205 mm (about 8 inches), or 295 to 305 mm (about 12 inches). In a case where the GaN crystal has a plate shape whose surface shape is not a circular shape, the maximum length that can be achieved by such a surface preferably satisfies such a numerical value range, and the minimum length that can be achieved by such a surface preferably satisfies such a numerical value range. In a case where the GaN crystal has an amorphous bulk shape, the maximum length that can be achieved by a cross section perpendicular to the growth direction of the crystal preferably satisfies such a numerical value range.

The surface area of a main surface of the GaN crystal is not particularly limited, is preferably 15 cm² or more, and can be 15 cm² or more and less than 50 cm², 50 cm² or more and less than 100 cm², 100 cm² or more and less than 200 cm², 200 cm² or more and less than 350 cm², 350 cm² or more and less than 500 cm², or 500 cm² or more and less than 750 cm². In a case where the GaN crystal has an amorphous bulk shape, the maximum area of a cross section perpendicular to the growth direction of the crystal that can be achieved preferably satisfies such a numerical value range.

The crystal mode of a main surface of the GaN crystal is not particularly limited, may be, for example, the c-plane, the a-plane, or the m-plane, and is particularly preferably the c-plane.

The GaN crystal is not particularly limited as long as it has a light emission lifetime (PL lifetime) by time-resolved photoluminescence (TRPL) measurement, of 5 ps or more and 200 ps or less, and has a PL lifetime of preferably 6 ps or more, more preferably 8 ps or more, further preferably 10 ps or more, particularly preferably 15 ps or more, and preferably less than 200 ps, more preferably 150 ps or less, further preferably 100 ps or less, further preferably 90 ps or less, particularly preferably 50 ps or less. Specifically, the crystal preferably contains at least a position where the PL lifetime is in the above range. The GaN crystal has a PL lifetime exceeding the lower limit of the above range, and thus can be a high-quality GaN crystal with specified point defects predominantly decreased and can serve as a highly functional GaN substrate capable of withstanding a high voltage and a large current as compared with a conventional GaN crystal, and can be suitably utilized for producing a semiconductor device. The expression "containing a position where the PL lifetime is 5 ps or more and 200 ps or less" means that, when the relevant GaN crystal is subjected to TRPL measurement, the PL lifetime is 5 ps or more and 200 ps or less at least any one measurement position of the GaN crystal, regardless of the interior or surface of the GaN crystal.

The PL lifetime of the GaN crystal is measured in the following conditions by time-resolved photoluminescence measurement. After the GaN crystal placed in a nitrogen atmosphere is excited with a third harmonic wave (photon energy 4.65 eV, repetition frequency 8 MHz) of $Al_2O_3$:Ti laser having a pulse width of 100 fs, the measurement can be performed in weak excitation conditions of a temperature of 295 K and an excitation density per pulse of 120 nJ/cm² in order to observe a non-radiative recombination process. A synchro-scan type streak camera having a time resolution of about 1 ps can be used for measuring the decay time of the band-edge luminescence intensity of GaN.

A region satisfying the above PL lifetime conditions is preferably a region corresponding to 50% or more of the GaN crystal. The region may correspond to preferably 55% or more, 60% or more, 65% or more, 70% or more, 80% or more, 90% or more, or 95% or more, most preferably 100% thereof, from the viewpoint of an enhancement in functionality of a semiconductor device, and a preferable range of the upper limit is not necessarily particularly set, and may be 99.99% or less, 99.9% or less, 99% or less, or 98% or less. For example, in a case where the GaN crystal, which has a bulk shape, is cut out to a plurality of plates (for example, 6 plates) and the PL lifetime on a surface of each of such GaN crystal plates is measured, a case where half (for example, 3 plates) or more of the total number of resulting GaN crystal plates satisfies the above PL lifetime conditions can be evaluated as a case where a region corresponding to 50% or more of such a bulk GaN crystal satisfies the above PL lifetime conditions. In another example, in a case where the PL lifetime is measured at a plurality of points (for example, 6 points) on a GaN crystal surface, a case where half (for example, 3 points) or more of the total number of such measurement points satisfies the above PL lifetime conditions can be evaluated as a case where a region corresponding to 50% or more of such a bulk GaN crystal satisfies the above PL lifetime conditions.

It has been found according to studies of the present inventors that the PL lifetime of a GaN crystal obtained by crystal growth according to an ammonothermal method tends to be shortened near a seed crystal at the initial of growth, the PL lifetime is elongated, as crystal growth is continued, and the PL lifetime is evened out if the growth is continued until a certain thickness is obtained. Therefore, the proportion of this region can also be adjusted by selecting a region to be obtained by slicing or the like, from the GaN crystal grown. The PL lifetime is usually almost the same in a region in a direction (direction in parallel with growth plane) perpendicular to the growth direction of the GaN crystal, and thus, in a case where the GaN crystal is sliced in the direction perpendicular to the growth direction, the PL lifetime on a sliced surface of the crystal sliced is uniform.

The present inventors have found that elongation of the PL lifetime can be achieved by suppression of specified crystal defects affecting the PL lifetime, specifically, suppression of generation of point defects due to incorporation of impurities of a GaN crystal obtained by crystal growth according to an ammonothermal method. Such point defects are, for example, dotted defects obtained by generation of holes due to abstraction of crystal-constituting atoms, and incorporation of impurities in the holes (replacement of the holes with impurities). A dislocation density described below is an index representing the density of linear crystal defects, and such defects are conceptually different from the point defects.

In a case where the GaN crystal is grown by an HVPE method, the PL lifetime of the GaN crystal is usually more than 200 ps to about 400 Ps, and can also be optionally 1000 ps. Thus, a GaN crystal obtained by an HVPE method is generally considered to contain few specified point defects. In this regard, a difference is that a GaN crystal obtained by an HVPE method is generally considerably higher in dislocation density than a GaN crystal obtained by an ammonothermal method, as described below.

It is presumed by the present inventors, from the viewpoint of the PL lifetime, that specified impurity element and point defect correlate with each other and the concentrations of impurity elements in the GaN crystal of the present embodiment, measured by SIMS (Secondary Ion Mass Spectrometry) analysis, are preferably in the following ranges.

The concentration of hydrogen (H) in the GaN crystal is preferably $2 \times 10^{19}$ atoms/cm³ or less, more preferably $1 \times 10^{19}$ atoms/cm³ or less, further preferably $5 \times 10^{18}$ atoms/cm³ or less, particularly preferably $1 \times 10^{18}$ atoms/cm³ or less. The GaN crystal of the present embodiment is grown by an ammonothermal method, and thus can contain H (hydrogen) at a concentration of $1 \times 10^{17}$ atoms/cm³ or more. The concentration of oxygen (O) in the GaN crystal is preferably $2\times10^{19}$ atoms/cm$^3$ or less, more preferably $1\times10^{19}$ atoms/cm$^3$ or less, further preferably $5\times10^{18}$ atoms/cm$^3$ or less, particularly preferably $1\times10^{18}$ atoms/cm$^3$ or less. The GaN crystal of the present embodiment is grown by an ammono-thermal method, and thus can contain H (hydrogen) at a concentration of $1\times10^{17}$ atoms/cm$^3$ or more and O (oxygen) at a concentration of $1\times10^{17}$ atoms/cm$^3$ or more.

In a case where the GaN crystal is grown with a miner-alizer containing fluorine (F), by an ammonothermal method, F may be contained at a concentration of $1\times10^{15}$ atoms/cm$^3$ or more, and the concentration is preferably $1\times10^{18}$ atoms/cm$^3$ or less, more preferably $5\times10^{17}$ atoms/cm$^3$ or less, further preferably $1\times10^{17}$ atoms/cm$^3$ or less from the viewpoint of elongation of the PL lifetime.

Since growth by an ammonothermal method using no compound containing any alkali metal, as a mineralizer, is preferable, the concentrations of lithium (Li), sodium (Na) and potassium (K) can be each less than $1\times10^{15}$ atoms/cm$^3$. The Fe concentration can achieve the order of $10^{15}$ atoms/cm$^3$ or less and the Ni concentration can achieve the order of $10^{15}$ atoms/cm$^3$ or less.

The dislocation density serving as an index of the density of linear defects in the GaN crystal is not particularly limited as long as any of the requirements (i) and (ii) is satisfied, and is preferably $5\times10^6$ cm$^{-2}$ or less, more preferably less than $1\times10^6$ cm$^{-2}$, further preferably $5\times10^5$ cm$^{-2}$ or less, particu-larly preferably $1\times10^5$ cm$^{-2}$ or less, and usually $1\times10^2$ cm$^{-2}$ or more. In a case where the GaN crystal is grown by an HVPE method, the dislocation density of the GaN crystal is usually equal to or more than the order of $10^6$ cm$^{-2}$. The GaN crystal preferably contains at least a region of 1 mm×1 mm, having the above dislocation density. Such a region of 1 mm×1 mm, having the above dislocation density, is typically preferably at least present on a surface of the crystal or any flat surface in parallel with the surface. Such any flat surface in parallel with the surface is here obtained as a new surface by, for example, slicing the GaN crystal in parallel with the surface of the crystal. The dislocation density can be evaluated by a method described in Examples below.

In the requirement (i), the FWHM in the 004 diffraction X-ray rocking curve in the GaN crystal is preferably 50 arcsec or less at least one position of the crystal, and is more preferably less than 50 arcsec, still more preferably 40 arcsec or less, particularly preferably 30 arcsec or less, especially preferably 20 arcsec or less, and usually 5 arcsec or more. The expression "FWHM in the 004 diffraction X-ray rocking curve is 50 arcsec or less at least one position of the crystal" means that, when the relevant GaN crystal is subjected to XRD measurement, the FWHM in the 004 diffraction X-ray rocking curve is 50 arcsec or less at least any one measurement position of the GaN crystal, regardless of the interior or surface of the GaN crystal.

It is typically preferable to have the above FWHM at least one measurement position on a surface of the crystal or any flat surface in parallel with the surface. Such any flat surface in parallel with the surface is here obtained as a new surface by, for example, slicing the GaN crystal in parallel with the surface of the crystal.

In a suitable example, the FWHM in the 004 diffraction X-ray rocking curve in a surface of the GaN crystal is preferably 100 arcsec or less, more preferably 50 arcsec or less, further preferably 30 arcsec or less, particularly pref-erably 20 arcsec or less, and usually 5 arcsec or more, at least one position of the surface.

The FWHM in the 004 diffraction X-ray rocking curve is a parameter measured by $\omega$ scanning with CuK$\alpha_1$ radiation, and the smaller the numerical value is, the more favorable the crystal quality is. The numerical value range of the FWHM in the 004 diffraction X-ray rocking curve may be satisfied at least one position of a surface of the GaN crystal, and is preferably satisfied in the entire surface.

In 004 diffraction X-ray rocking curve measurement, an X-ray tube is operated at a voltage of 45 kV and a current of 40 mA, and CuK$\alpha$ ray monochromated with a Ge(440)4 crystal symmetric monochromator is allowed to be incident into the GaN crystal. The direction in which X-ray is allowed to be incident into the GaN crystal is not particularly limited, and a plane into which X-ray is incident may be, for example, perpendicular to the a-axis.

The beam size of X-ray is set so that, when the incident angle (angle between reflection plane and X-ray) is 90°, namely, when X-ray is allowed to be incident into a Ga-polar plane as a measurement plane, the size of an irradiation area on the GaN crystal is 5 mm in a direction in parallel with an $\omega$-axis and 1 mm in a direction perpendicular to the G-axis. The $\omega$-axis is a rotational axis of a sample in rocking curve measurement.

In a case where the beam size of X-ray is thus set, $\omega$ is about 36.5° in 004 diffraction X-ray rocking curve measure-ment of the GaN crystal and thus the size of an irradiation area on the GaN crystal is about 1.7×5 mm$^2$.

In a case where the diameter of the GaN crystal exceeds 40 mm, $\omega$ scanning can be performed with respect to 1 mm over a length of 40 mm along with one line on the GaN crystal, in the above conditions, thereby obtaining a 004 diffraction X-ray rocking curve with 40 measurement points $P_M$ aligned at a pitch of 1 mm on the line. In this case, the $\omega$-axis is perpendicular to a line L in the w scanning at each of the measurement points $P_M$. In other words, X-ray is allowed to be incident into the GaN crystal so that a plane into which X-ray is incident and the line are in parallel with each other.

In a suitable example, when such measurement is con-ducted along with at least one line on the GaN crystal, the maximum value of the FWHM in the 004 diffraction X-ray rocking curve, among all measurement points, can be 50 arcsec or less.

The average value of the FWHM in the 004 diffraction X-ray rocking curve, among all the measurement points, can be 100 arcsec or less, furthermore 50 arcsec or less, further-more 30 arcsec or less, furthermore 20 arcsec or less, and usually 5 arcsec or more.

The GaN crystal grown by an ammonothermal method can exhibit a peak assigned to a gallium hole-hydrogen composite at 3140 to 3200 cm$^{-1}$ of an infrared absorption spectrum.

The crystal grown exhibits band-edge luminescence around a luminescence wavelength of 350 to 380 nm (pho-ton energy 3.2 to 3.6 eV), and in general, a peak of such band-edge luminescence, more preferably, is exhibited at a wavelength closer to that corresponding to the forbidden band width of the relevant substance (for example, in the case of a strain-free GaN crystal, around 356 nm at a low temperature of 10 K, or around a photon energy of 3.48 eV) and is narrower in full width at half height thereof, because a crystal with few impurities is meant. A higher band-edge luminescence intensity is preferable because of meaning a higher purity.

In general, the crystal quality can be determined by the intensity ratio (YL/NBE) between the band-edge lumines-cence (NBE) and a yellow band luminescence (YL) observed at a luminescence wavelength of 500 to 600 nm. The yellow band luminescence is observed in the case of the presence of Ga defects, and thus a lower value of YL/NBE can be said to mean a crystal with fewer defects.

The intensity ratio (YL/NBE) of the yellow band luminescence (YL) observed at a luminescence wavelength of 500 to 600 nm to the band-edge luminescence (NBE) of the GaN crystal is preferably 10 or less, more preferably 1 or less, most preferably 0.8 or less.

A broad peak is observed around a photon energy of 2.9 eV (luminescence wavelength 400 to 470 nm) in low-temperature PL measurement and the presence of a blue luminescence band (BL) is observed, with respect to the GaN crystal of the present embodiment. The intensity ratio (BL/NBE) of the blue luminescence band (BL) observed at a luminescence wavelength of 400 to 470 nm to the band-edge luminescence (NBE) of the GaN crystal is preferably 0.1 or less, preferably 0.01 or less, preferably 0.007 or less. A lower value of the intensity ratio (BL/NBE) is presumed to mean a crystal with fewer point defects.

The GaN crystal can be commonly evaluated at high accuracy with measurement according to the 004 diffraction X-ray rocking curve, and the GaN crystal can also be evaluated with measurement according to the following 002 diffraction X-ray rocking curve.

The FWHM in the 002 diffraction X-ray rocking curve in the GaN crystal is preferably 50 arcsec or less at least one position of the crystal, and is more preferably less than 50 arcsec, still more preferably 40 arcsec or less, particularly preferably 30 arcsec or less, especially preferably 20 arcsec or less, and usually 5 arcsec or more. The expression "FWHM in the 002 diffraction X-ray rocking curve is 50 arcsec or less at least one position of the crystal" means that, when the relevant GaN crystal is subjected to XRD measurement, the FWHM in the 002 diffraction X-ray rocking curve is 50 arcsec or less at least any one measurement position of the GaN crystal, regardless of the interior or surface of the GaN crystal.

It is typically preferable to have the above FWHM at least one measurement position on a surface of the crystal or any flat surface in parallel with the surface. Such any flat surface in parallel with the surface is here obtained as a new surface by, for example, slicing the GaN crystal in parallel with the surface of the crystal.

In a suitable example, the FWHM in the 002 diffraction X-ray rocking curve in a surface of the GaN crystal is preferably 50 arcsec or less, more preferably 40 arcsec or less, further preferably 30 arcsec or less, particularly preferably 20 arcsec or less, and usually 5 arcsec or more, at least one position of the surface.

The FWHM in the 002 diffraction X-ray rocking curve is a parameter measured by $\omega$ scanning with CuK$\alpha_1$ radiation, and the smaller the numerical value is, the more favorable the crystal quality is. The FWHM in the 002 diffraction X-ray rocking curve may be satisfied at least one position of a surface of the GaN crystal, and is preferably satisfied in the entire surface.

In (002) X-ray rocking curve measurement, an X-ray tube is operated at a voltage of 45 kV and a current of 40 mA, and CuK$\alpha$ ray monochromated with a Ge(440)4 crystal symmetric monochromator is allowed to be incident into the GaN crystal. The direction in which X-ray is allowed to be incident into the GaN crystal is not particularly limited, and a plane into which X-ray is incident may be, for example, perpendicular to the a-axis.

The beam size of X-ray is set so that, when the incident angle (angle between reflection plane and X-ray) is 90°, namely, when X-ray is allowed to be incident into a Ga-polar plane as a measurement plane, the size of an irradiation area on the GaN crystal is 5 mm in a direction in parallel with an $\omega$-axis and 1 mm in a direction perpendicular to the $\omega$-axis. The $\omega$-axis is a rotational axis of a sample in rocking curve measurement.

In a case where the beam size of X-ray is thus set, $\omega$ is about 36.5° in 002 diffraction X-ray rocking curve measurement of the GaN crystal and thus the size of an irradiation area on the GaN crystal is about 1.7×5 mm$^2$.

In a case where the diameter of the GaN crystal exceeds 40 mm, $\omega$ scanning can be performed with respect to 1 mm over a length of 40 mm along with one line on the GaN crystal, in the above conditions, thereby obtaining a 002 diffraction X-ray rocking curve with 40 measurement points $P_M$ aligned at a pitch of 1 mm on the line. In this case, the $\omega$-axis is perpendicular to a line L in the $\omega$ scanning at each of the measurement points $P_M$. In other words, X-ray is allowed to be incident into the GaN crystal so that a plane into which the X-ray is incident and the line are in parallel with each other.

In a suitable example, when such measurement is conducted along with at least one line on the GaN crystal, the maximum value of the FWHM in the 002 diffraction X-ray rocking curve, among all measurement points, can be 50 arcsec or less.

The average value of the FWHM in the 002 diffraction X-ray rocking curve, among all the measurement points, can be 100 arcsec or less, furthermore 50 arcsec or less, furthermore 30 arcsec or less, furthermore 20 arcsec or less, and usually 5 arcsec or more.

The GaN crystal is preferably such that, when the 002 diffraction X-ray rocking curve is measured on a line segment at an interval of 1 mm, at least one line segment of 10 mm or more can be drawn on which the difference between the maximum value and the minimum value of a peak angle in the X-ray rocking curve, among all measurement points, is less than 0.2°. The difference between the maximum value and the minimum value of a peak angle in the X-ray rocking curve, among all measurement points, may be less than 0.2°, preferably less than 0.15°, and more preferably less than 0.1°.

The curvature radius of the GaN crystal may be 50 m or more, preferably 70 m or more, and more preferably 80 m or more, and the upper limit thereof is not especially limited, and may be, for example, 1000 m or less. The curvature radius can be determined from, for example, the difference between the maximum value and the minimum value of a peak angle in the 002 diffraction X-ray rocking curve, among all measurement points, in measurement of the X-ray rocking curve on a line segment at an interval of 1 mm.

<Method for Producing Gallium Nitride Crystal>

A method for producing the GaN crystal is not especially restricted as long as it includes a step of growing the crystal by an ammonothermal method, and the GaN crystal can be produced by, for example, the following method.

Specifically, the method includes a step of controlling a nitrogen-containing solvent in a supercritical state and/or a subcritical state in a reaction vessel to which a seed crystal having a hexagonal crystal structure, the nitrogen-containing solvent, a raw material, and a mineralizer are placed, to thereby grow the GaN crystal on a surface of the seed crystal.

The GaN crystal is grown at a ratio of the volume to the surface area in the reaction vessel (inner volume (cm$^3$)/inner surface area (cm$^2$)), of 2 (cm) or more, and at a pressure in the reaction vessel, of 5 to 200 MPa, from the viewpoint that the GaN crystal, which has a desired PL lifetime, is obtained, and then from the viewpoint that generation of specified point defects associated with the PL lifetime, in the GaN crystal, is suppressed.

Another aspect of the present disclosure includes the following method. In other words, a method for producing the gallium nitride crystal is exemplified which involves growing the gallium nitride crystal by an ammonothermal method, with a reaction vessel having a ratio of the volume to the inner surface area in the reaction vessel (volume $(cm^3)$/inner surface area $(cm^2)$), of 1.5 cm or more.
(Mineralizer)

The type of the mineralizer is not particularly limited, a fluorine-containing mineralizer is preferable and examples thereof include ammonium fluoride, hydrogen fluoride, hydrocarbylammonium fluoride, an alkylammonium salt such as tetramethylammonium fluoride, tetraethylammonium fluoride, benzyltrimethylammonium fluoride, dipropylammonium fluoride or iropropylammonium fluoride, alkyl metal fluoride such as alkyl sodium fluoride, alkali earth metal fluoride, or metal fluoride. In particular, alkali fluoride, alkali earth metal fluoride, metal fluoride, ammonium fluoride, or hydrogen fluoride is preferable, alkali fluoride, ammonium fluoride, or fluoride of an element in Group 13 in the periodic table is further preferable, ammonium fluoride $(NH_4F)$ or gallium fluoride is particularly preferable. These mineralizers may be used singly or in combination of two or more kinds thereof. The fluorine-containing mineralizer is used to result in a tendency to obtain a high-quality crystal having a desired PL lifetime and a favorable crystallinity. It is more preferable to use a mineralizer containing only fluorine as a halogen element.

The mineralizer here used may be only such a fluorine-containing mineralizer, or a mixture of such a fluorine-containing mineralizer and a fluorine-free mineralizer. Examples of the fluorine-free mineralizer can include an acidic mineralizer including halogen other than fluorine and an ammonium ion, such as ammonium chloride, ammonium iodide, or ammonium bromide; a neutral mineralizer including an alkali metal and halogen, such as lithium chloride, lithium bromide, lithium iodide, sodium chloride, sodium bromide, sodium iodide, potassium chloride, potassium bromide, or potassium iodide; a neutral mineralizer including an alkali earth metal and halogen, such as beryllium chloride, beryllium bromide, beryllium iodide, magnesium chloride, magnesium bromide, magnesium iodide, calcium chloride, calcium bromide, or calcium iodide; or a basic mineralizer such as an alkali earth metal amide, rare-earth amide, an alkali metal nitride, an alkali earth metal nitride, an azide compound, or any other hydrazine salt. In a case where the fluorine-containing mineralizer and the fluorine-free mineralizer are used, the proportion of the fluorine-containing mineralizer in the total mineralizer is preferably 50% by mol or more, more preferably 60% by mol or more, further preferably 80% by mol or more, and may be 100% by mol or less. The fluorine-free mineralizer here used is preferably a mineralizer containing halogen other than fluorine, from the viewpoint of control of the shape of a crystal grown by use of orientation dependence of the growth rate by the mineralizer, and control of miscellaneous crystal precipitation, and in this case, the proportion of fluorine in the total halogen in the mineralizer is preferably 50% or more, more preferably 60% or more, further preferably 80% or more, and may be 100% by mol or less.

The mineralizer preferably exhibits negative solubility characteristics in a nitrogen-containing solvent around a temperature at which the GaN crystal is grown. For example, ammonium fluoride exhibits negative solubility characteristics in ammonia in a temperature region of 400° C. or more. Since the temperature in the crystal growth region is usually preferably set to 450° C. or more, ammonium fluoride exhibits negative solubility characteristics at the crystal growth temperature in a case where only ammonium fluoride is used as the mineralizer. On the other hand, in the case of use in combination with ammonium chloride or the like exhibiting positive solubility characteristics at the temperature, the slope of a solubility curve, determined based on solubility characteristics of each one depending on the mixing ratio, is varied. Since a low absolute value of the slope of a solubility curve leads to a decrease in efficiency of crystal growth, the mixing ratio is adjusted so that a solubility curve having an appropriate slope is exhibited.

The molar concentration of fluorine contained in the mineralizer relative to the nitrogen-containing solvent is preferably 0.2% by mol or more, more preferably 0.27% by mol or more, further preferably 1.0% by mol or more, particularly preferably 1.5% by mol or more, and preferably 30% by mol or less, more preferably 20% by mol or less, further preferably 10% by mol or less, particularly preferably 2% by mol or less. A high concentration is preferable because of resulting in a tendency to enhance the solubility of the raw material in the nitrogen-containing solvent and increase the growth rate. In this regard, a low concentration is preferable because an appropriate solubility can be kept to thereby suppress spontaneous nucleation and/or keep a low degree of supersaturation, thereby facilitating control.
(Pressure)

The pressure in the reaction vessel in crystal growth is set to 5 MPa or more and 200 MPa or less from the viewpoint that the GaN crystal, which has a desired PL lifetime, is obtained, namely, from the viewpoint that generation of point defects in the GaN crystal is suppressed, and thus crystal growth is made. The pressure in the reaction vessel is preferably 10 MPa or more, more preferably 12 MPa or more, further preferably 15 MPa or more, particularly preferably 20 MPa or more, and preferably 150 MPa or less, more preferably 120 MPa or less, further preferably 100 MPa or less. A production method according to an embodiment of the present invention is characterized in that the GaN crystal can be efficiently grown even under a relatively low pressure. If crystal growth is made at a relatively low pressure, the wall thickness of a pressure-resistant vessel can be thinner and the energy efficiency can be increased to result in cost saving. In addition, crystal growth is made at a relatively low pressure equal to or less than the lower limit value, resulting in not only a tendency to enable a desired PL lifetime to be obtained, but also a tendency to obtain a high-quality crystal having a favorable crystallinity.
(Seed Crystal)

A seed crystal (hereinafter, also referred to as "seed".) is not particularly limited, and is preferably a seed crystal having a hexagonal crystal structure, particularly preferably a crystal having the same elemental composition as that of an objective GaN crystal. The seed crystal having a hexagonal crystal structure, here used, is preferably nitride of an element in Group 13 in the periodic table. Examples include a single crystal of nitride such as gallium nitride or aluminum nitride.

The seed crystal can be determined in consideration of the solubility in the solvent and reactivity with the mineralizer. For example, the seed crystal of GaN can be any of a single crystal obtained by release after epitaxial growth on a heterogeneous substrate of sapphire or the like, a single crystal obtained by crystal growth from metallic Ga with Na, Li, or Bi as a flux, a single crystal obtained by homo/hetero epitaxial growth with a liquid-phase epitaxy method (LPE method), a single crystal produced based on a solution growth method, and a crystal obtained by cutting thereof. A specific method of the epitaxial growth is not particularly limited, and, for example, a hydride vapor phase epitaxy method (HVPE) method, an organometallic chemical vapor deposition method (MOCVD method), a liquid phase method, or an ammonothermal method can be adopted.
(Nitrogen-Containing Solvent)

A nitrogen-containing solvent is used as the solvent.

Examples of the nitrogen-containing solvent include a solvent not impairing any stability of the GaN crystal grown. Examples of the solvent can include ammonia, hydrazine, urea, an amine compound (for example, primary amine such as methylamine, secondary amine such as dimethylamine, tertiary amine such as trimethylamine, or diamine such as ethylenediamine), or melamine. These solvents may be used singly or as a mixture thereof.

The amounts of water and oxygen contained in the solvent are desirably as small as possible, and the contents of water and oxygen in the solvent are singly, or preferably in total, preferably 1000 ppm by weight or less, more preferably 10 ppm by weight or less, further preferably 0.1 ppm by weight or less, and the lower limit thereof is not especially limited and may be 0 ppm by weight or more (0 ppm by weight means the detection limit or less). In a case where ammonia is used as the solvent, the purity is usually 99.9% by weight or more, preferably 99.99% by weight or more, further preferably 99.999% by weight or more, and the upper limit thereof is not especially limited and may be 100% by weight or less, or less than 100% by weight.
(Raw Material)

The raw material here used is a raw material containing an element constituting the GaN crystal to be grown on the seed crystal. A polycrystal raw material of the GaN crystal and/or any metal to be formed into nitride are/is more preferable, and gallium nitride and/or metallic gallium are/is more preferable. The polycrystal raw material is not necessarily complete nitride, and may contain a metal component where an element in Group 13 in the periodic table is in the state of a metal (zero-valent) depending on conditions, and examples include a mixture of gallium nitride and metallic gallium in a case where the crystal is gallium nitride.

A method for producing the polycrystal raw material is not particularly limited. For example, a nitride polycrystal can be used which is generated by reaction of a metal or an oxide or hydroxide thereof with ammonia in a reaction vessel through which ammonia gas flows. A metal compound raw material higher in reactivity, here used, can be, for example, a compound having a covalently bound M-N bond, such as halide, an amide compound, an imide compound, or galazan. A nitride polycrystal produced by reaction of a metal such as Ga with nitrogen at a high temperature and a high pressure can also be used.

The amounts of water and oxygen contained in the polycrystal raw material used as the raw material are preferably small. The content of oxygen in the polycrystal raw material is usually 10000 ppm by weight or less, preferably 1000 ppm by weight or less, particularly preferably 1 ppm by weight or less, and the lower limit thereof is not especially limited and may be 0 ppm by weight or more (0 ppm by weight means the detection limit or less). Ease of incorporation of oxygen into the polycrystal raw material is associated with reactivity with or absorption ability of water. As the crystallinity of the polycrystal raw material is poorer, an active group such as a NH group is more present in a surface, and can react with water to partially generate an oxide or hydroxide. Thus, the polycrystal raw material here used is usually preferably one having a high crystallinity as much as possible. The crystallinity can be estimated by the half-value width in powder X-ray diffraction, and the half-value width in the (100) diffraction line ($2\theta$=about 32.5° in hexagonal type gallium nitride) is usually 0.25° or less, preferably 0.20° or less, further preferably 0.17° or less.
(Reaction Vessel)

The growth reaction of the GaN crystal is performed in a reaction vessel. The reaction vessel here means a vessel for production of the GaN crystal in a state where the nitrogen-containing solvent in a supercritical state and/or a subcritical state can be directly contacted with an inner wall face of the vessel, and preferable examples thereof include a structure itself in a pressure-resistant vessel or a capsule disposed in a pressure-resistant vessel.

A pressure-resistant portion of the reaction vessel is preferably constituted from any of a Ni-based alloy, a Fe-based alloy, or a cobalt-based alloy, or an alloy of a combination thereof, particularly preferably a Ni—Fe-based alloy (particularly preferably, the content of Fe in the Ni—Fe-based alloy is 30 to 40% by mass and Cr, Ti, Al, or Nb is contained as any other element).

A mode of constitution of the reaction vessel by such an alloy is not particularly limited. The reaction vessel may be formed by directly lining or coating an inner surface of the pressure-resistant portion with a material excellent in corrosion resistance, or a capsule including a material excellent in corrosion resistance may be placed in the pressure-resistant vessel.

The shape of the reaction vessel can be any of shapes including a cylindrical shape. The reaction vessel may be vertically placed, laterally placed, or obliquely placed.

A platinum group or a platinum group alloy can be used in the lining material or the capsule in the above corrosive-resistant portion. Examples of the platinum group include Pt, Au, Ir, Ru, Rh, Pd, or Ag. In the present production method, a compound containing fluorine can be used singly as the mineralizer, and thus Ag or an alloy containing Ag can be suitably used as the lining material.

The ratio of the volume to the surface area in the reaction vessel (volume ($cm^3$)/inner surface area ($cm^2$)), while has been conventionally commonly small in order to achieve stabilization of production conditions, such as uniforming of the temperature in crystal growth, and then in order to secure homogeneousness of the resulting GaN crystal, is preferably large in production of the GaN crystal according to the present embodiment, from the viewpoint that the GaN crystal, which has a desired PL lifetime, is obtained, namely, from the viewpoint that generation of point defects in the GaN crystal is suppressed, and the ratio is 2 (cm) or more, preferably 3 (cm) or more, more preferably 4 (cm) or more, further preferably 5 (cm) or more, particularly preferably 6 (cm) or more, and preferably 16 (cm) or less, more preferably 12 (cm) or less, further preferably 9 (cm) or less, particularly preferably 7 (cm) or less. In a case where the ratio is equal to or more than the lower limit of the above range, incorporation of impurities due to contact with an inner wall or the like of the reaction vessel is suppressed and thus point defects in the GaN crystal are decreased and the GaN crystal, which has a desired PL lifetime, is easily obtained. In a case where the ratio is equal to or less than the upper limit of the above range, the GaN crystal is easily stabilized in quality from the viewpoint of ease of temperature difference control and ease of supersaturation control.

The diameter in the reaction vessel, while has been commonly small from the same reason as described above, is preferably 100 mm or more, more preferably 120 mm or more, further preferably 150 mm or more, and preferably 650 mm or less, more preferably 550 mm or less, further preferably 450 mm or less in production of the GaN crystal according to the present embodiment, from the viewpoint of suppression of generation of point defects in the GaN crystal.

(Crystal Growth)

The GaN crystal is grown on a surface of the seed crystal having a hexagonal crystal structure, by controlling the nitrogen-containing solvent in a supercritical state and/or a subcritical state in the reaction vessel to which the seed crystal, the solvent, the raw material, and the mineralizer are placed. The pressure condition here is as described above.

The temperature in growth is set so that the temperature in a raw material dissolution region where the raw material is dissolved and the temperature in a crystal growth region where the crystal is grown on the seed crystal are different. The temperature in the crystal growth region is preferably 450° C. or more, more preferably 500° C. or more, further preferably 550° C. or more. The temperature in the crystal growth region may be high, and can be preferably set to, for example, 700° C. or less, or 650° C. or less. The temperature in the raw material dissolution region is set higher than the temperature in the crystal growth region in the case of use of the mineralizer having negative solubility characteristics. The temperature in the raw material dissolution region is set lower than the temperature in the crystal growth region in the case of use of the mineralizer having positive solubility characteristics. The temperature difference between the raw material dissolution region and the crystal growth region is usually set to 30° C. or more, preferably set to 40° C. or more, and is usually set to 150° C. or less, preferably set to 120° C. or less.

The GaN crystal is grown under the above conditions, thereby enabling the crystal to be grown at a relatively high growth rate. Such conditions can be optimized to thereby allow the crystal growth rate to be 300 µm/day or more, 500 µm/day or more, even 700 µm/day or more, or furthermore 900 µm/day or more. Even in a case where such growth is carried out at a low temperature and a low pressure, a higher growth rate than that in a conventional method can be realized.

(Preparation Step)

A preparation step of placing the seed crystal, the nitrogen-containing solvent, and the raw material in the reaction vessel, before the growth step, may also be included in addition to the growth step. A method for placing such materials in the reaction vessel is not particularly limited, and examples include a method involving disposing the seed crystal on a lower portion of the reaction vessel and the raw material on an upper portion of the reaction vessel, and then pouring the nitrogen-containing solvent.

(Degassing Step)

A degassing step of subjecting the content of the reaction vessel to heating and degassing, before the growth step, may be preferably included in addition to the growth step in order to obtain the GaN crystal, which has a high purity. The degassing step can be included to result in a decrease of oxygen in the content of the reaction vessel and adjustment of the amount of oxygen as an impurity contained in the GaN crystal.

A heating and degassing method is not particularly limited and can be carried out by a known method, and examples include a method involving degassing by a vacuum pump with heating.

The temperature in heating and degassing is not particularly limited and the temperature range is preferably 80° C. or more, more preferably 120° C. or more, further preferably 160° C. or more, and preferably 300° C. or less, more preferably 280° C. or less, further preferably 260° C. or less.

A higher degree of vacuum in heating and degassing is more preferable, and the degree of vacuum is usually preferably $5\times10^{-4}$ Pa or less, more preferably $1\times10^{-4}$ Pa or less, further preferably $5\times10^{-5}$ Pa or less.

While a longer heating and degassing time is more preferable because the effect of decreasing oxygen as an impurity is high, a shorter heating and degassing time results in an enhancement in productivity and a reduction in cost. The heating and degassing time is preferably 2 hours or more, more preferably 6 hours or more, further preferably 12 hours or more, and preferably 72 hours or less, more preferably 48 hours or less, particularly preferably 24 hours or less.

(Processing Step)

A processing step of processing the GaN crystal, after the growth step, may be included in addition to the growth step. Such processing is considered to, for example, slice the GaN crystal obtained and thus obtain only a portion having desired characteristics, and is most preferably to obtain only a portion satisfying the above PL lifetime range. The GaN crystal obtained can be thus used as a GaN substrate described below.

As described above, in general, in a case where the GaN crystal is sliced perpendicularly to its growth direction (direction in parallel with growth plane), the PL lifetime on a sliced surface of the crystal sliced is uniform.

<Gallium Nitride Substrate and Production Method Thereof>

Another embodiment of the present invention provides a gallium nitride substrate (hereinafter, also referred to as "GaN substrate") obtained by slicing the GaN crystal, and a production method thereof.

The diameter of the GaN substrate is, for example, 50 mm or more, typically 50 to 55 mm (about 2 inches), 100 to 105 mm (about 4 inches), or 150 to 155 mm (about 6 inches). The GaN substrate is demanded to have strength at a level causing no difficulty in handling, and thus the thickness is usually 250 µm or more and can be thicker depending on the diameter.

When the diameter of the GaN substrate is about 2 inches, the thickness is preferably 250 µm or more, more preferably 300 µm or more, and preferably 450 µm or less, more preferably 400 µm or less.

When the diameter of the GaN substrate is about 4 inches, the thickness is preferably 350 µm or more, more preferably 400 µm or more, and preferably 750 µm or less, more preferably 650 µm or less.

When the diameter of the GaN substrate is about 6 inches, the thickness is preferably 450 µm or more, more preferably 550 µm or more, and preferably 800 µm or less, more preferably 700 µm or less.

The GaN substrate can be preferably used for the production of a nitride semiconductor device.

A production process of such a GaN semiconductor device involves epitaxially growing one or more nitride semiconductor layers on a main surface of the GaN substrate, to thereby form an epitaxial wafer. An epitaxial growth method here preferably used can be a gas phase method such as MOVPE (Metal Organic Vapor Phase Epitaxy), MBE (Molecular Beam Epitaxy), PXD (Pulsed Excitation Deposition), sputtering, or HVPE.

Such a nitride semiconductor layer epitaxially grown can be n-type conductive, p-type conductive or semi-insulating by doping.

In a case where time-resolved photoluminescence measurement is performed on two or more different points on such a main surface of the GaN substrate, the difference in PL lifetime at each measurement point is preferably 30 ps or less, more preferably 20 ps or less, further preferably 10 ps or less, particularly preferably 5 ps or less, and the lower limit is not necessarily set and is most preferably 0 ps or more. It is here meant that the above numerical value or less is achieved even if any two points are selected on such a main surface of the GaN substrate. The GaN substrate, which is small in difference in PL lifetime, can be obtained by, for example, slicing the GaN crystal in a direction perpendicular to the crystal growth direction.

In another aspect, the GaN substrate may have at least two points where the difference in PL lifetime at each measurement point in time-resolved photoluminescence measurement of such a main surface of the GaN substrate is 1 ps or more, and the difference may be 5 ps or more, may be 10 ps or more, or may be 15 ps or more. The GaN substrate, where the difference in PL lifetime is a specified numerical value or more, can be obtained by, for example, slicing the GaN crystal in a direction obliquely inclined relative to the crystal growth direction.

A method for producing the GaN substrate preferably includes a step of performing selection so that a region satisfying the numerical value range of the PL lifetime in time-resolved photoluminescence measurement of the GaN crystal is cut out, and slicing the GaN crystal. Specifically, such selection is performed so that a region having at least a position satisfying the numerical value range in the crystal is cut out. In general, in a case where the GaN crystal is sliced perpendicularly to its growth direction (direction in parallel with growth plane), the PL lifetime on a sliced surface of the crystal sliced is uniform. On the other hand, in a case where the crystal is sliced on a plane inclined at a predetermined angle relative to a plane (plane in parallel with growth plane) perpendicular to its growth direction, the PL lifetime on a sliced surface of the crystal sliced has a distribution reflecting the change along with the growth direction.

The PL lifetime by time-resolved photoluminescence measurement, of the GaN crystal, in a region corresponding to 50% or more of a surface cut out of the GaN substrate, preferably a main surface thereof, is preferably in the above numerical value range of the PL lifetime of the GaN crystal, and the proportion of the region of the surface of the GaN substrate is more preferably 70% or more, 80% or more, 90% or more, 95% or more, 99% or more, and the upper limit is not necessarily set and may be 100% or less or may be 99.99% or less.

Still another embodiment of the present invention provides the following method for producing a gallium nitride substrate (hereinafter, also referred to as "GaN substrate").

The method for producing a GaN substrate includes a step of growing a gallium nitride crystal (GaN crystal) having a thickness of 500 µm or more on a gallium nitride seed (GaN seed), by an ammonothermal method, and cutting out the gallium nitride crystal grown, to a plate shape, to produce a gallium nitride substrate, in which the gallium nitride substrate has a light emission lifetime by time-resolved PL (TRPL) measurement, of 5 ps or more and 200 ps or less. Specifically, the method for producing a gallium nitride substrate is provided in which a position at which the light emission lifetime by time-resolved PL (TRPL) measurement is 5 ps or more and 200 ps or less is at least present.

The GaN seed used in the above crystal growth is not especially limited, any known one may be used, and the above GaN substrate according to another embodiment of the present invention is preferably used.

The growth conditions in the above method for producing the GaN crystal can be applied to the above growth of the GaN crystal on the GaN seed by an ammonothermal method.

The thickness of the GaN crystal grown on the GaN seed, by an ammonothermal method, is 500 µm or more, and may be preferably 600 µm or more, 700 µm or more, 800 µm or more, or 900 µm or more.

The conditions with respect to the GaN crystal and the GaN substrate, where applicable, can be applied to the conditions of the method for producing the GaN substrate.

Examples of a nitride semiconductor device that can be produced with the GaN substrate include a light-emitting device such as a light-emitting diode (LED) or a laser diode (LD), an electronic device such as a rectifier, a bipolar transistor, a field-effect transistor, or a HEMT (High Electron Mobility Transistor), a semiconductor sensor such as a temperature sensor, a pressure sensor, a radiation sensor, or a visible-ultraviolet detector, or a solar cell.

Other application of the GaN substrate is, for example, a seed in growth of a bulk GaN crystal by HVPE, THVPE (Tri-Halide Vapor Phase Epitaxy), OVPE (Oxide Vapor Phase Epitaxy), an ammonothermal method, a Naflux method, or any of other various methods.

EXAMPLES

Hereinafter, the features of the present invention will be specifically described with reference to Examples and Comparative Examples. Any material, amount of use, proportion, treatment procedure, and the like shown in the following Examples can be appropriately changed without departing from the gist of the present invention. Accordingly, the scope of the present invention should not be interrupted in a limited way by specific examples shown below.

<Evaluation Method>

(1) Analysis of Impurities in GaN Crystal

Impurity elements in the GaN crystal were analyzed by Secondary Ion Mass Spectrometry (SIMS). The measurement apparatus here used was a secondary ion mass analysis apparatus.

(2) PL Lifetime

The PL lifetime of the GaN crystal was measured by exciting the GaN crystal placed in a nitrogen atmosphere, with a third harmonic wave (photon energy 4.65 eV, repetition frequency 8 MHz, spot size 94 µmφ) of $Al_2O_3$:Ti laser having a pulse width of 100 fs, by use of a time-resolved photoluminescence-fluorescence spectrophotometer, and then observing the GaN crystal being retained in weak excitation conditions of a temperature of 295 K and an excitation density per pulse of 120 nJ/cm$^{-2}$. Here, a synchroscan type streak camera having a time resolution of about 1 ps was used for measuring the decay time of the band-edge luminescence intensity of the GaN crystal.

(3) FWHM in X-Ray Rocking Curve

The 002 Diffraction and 004 diffraction X-ray rocking curve measurements were each performed at a position apart from an edge of a Ga-polar plane.

In the measurements, a line focus CuKα radiation source included in an X-ray diffraction apparatus [Panalytical X'Pert Pro MRD manufactured by Spectris] was operated at 45 kV and 40 mA, and CuKα$_1$ ray was obtained with a Ge(440)4 crystal symmetric monochromator. The optical system here used was a parallel optical system, and a ½ slit, an X-ray mirror and a cross slit of w1 mm×h1 mm were used at an incident side. The detector here used was a OD mode of PIXcel3D (registered trademark), as a semiconductor pixel detector. The angle resolution was 5 to 6 arcsec.

The size of X-ray beam was set so that the size of an irradiation area on a Ga-polar plane of a sample substrate in a direction in parallel with the ω-axis was 5 mm and that in a direction perpendicular to the ω-axis was 1 mm at an incident angle of 90°, namely, in incidence of X-ray perpendicular to the Ga-polar plane.

X-ray was incident to the sample in a direction perpendicular to the a-axis of the GaN crystal in rocking curve measurement. In other words, the plane to which X-ray was incident was in parallel with the a-plane of the GaN crystal.

(4) Dislocation Density

The dislocation density can be measured by counting an etch pit. The (0001) plane of a c-plane GaN substrate is subjected to mechanochemical polishing (CMP) finishing, and etched with 89% sulfuric acid heated to 270° C., for 1 hour, to form an etch pit. Such etch pit and threading dislocation correspond to each other one-to-one, and thus the dislocation density can be determined by observing the GaN substrate with an etch pit formed, with an optical microscope, and counting the number of such etch pits. Since the (000-1) plane of an as-grown crystal is exposed to etching in supercritical ammonia during temperature drop after the termination of crystal growth and thus an etch pit is formed, an approximate dislocation density can be calculated by observing the (000-1) plane of the as-grown crystal with an optical microscope.

Example 1

In the present Example, a GaN crystal was grown with a reaction apparatus illustrated in FIG. 1.

An autoclave (ratio of volume to inner surface area: 2.3 (cm)) made of a Ni—Fe-based alloy, having an inner surface lined with Ag, was used as a pressure-resistant vessel, to perform crystal growth. A packing operation to a vessel with an outer wall 3 was performed in the air atmosphere.

Six hexagonal GaN single crystals (about 5 mm×15 mm×0.4 mm) grown by an ammonothermal method were each used for a seed crystal 6. The (000-1) plane as a main plane of the seed crystal was subjected to chemical mechanical polishing (CMP) finishing or etching finishing with KOH. Such a seed crystal 6 was hung on a seed crystal support frame made of molybdenum, with a tungsten wire having a diameter of 0.2 mm, and was disposed in a lower crystal growth region 2 of the autoclave.

A baffle plate 5 made of molybdenum was placed between the lower crystal growth region 2 and an upper raw material dissolution region 1. Furthermore, 5800 g of a polycrystal GaN grain as a raw material 4 was weighed, and placed in the upper region of the autoclave (raw material dissolution region 1). Next, $NH_4F$ sufficiently dried, having a purity of 99.9%, was weighed as a mineralizer source so as to be at 10% by mol relative to ammonia packed, and was loaded into a pressure-resistant vessel.

Subsequently, a lid of the autoclave equipped with a valve was closed. Next, a conductor was operated so as to pass to a vacuum pump via the valve attached in the autoclave, and the valve was opened for vacuum deaeration. Thereafter, the autoclave was cooled by a dry ice-methanol solvent with a vacuum state being kept, and the valve was closed once. Subsequently, the conductor was operated so as to pass to a $NH_3$ tank, thereafter the valve was again opened and $NH_3$ was continuously packed in the autoclave with not being airing out, and the valve was again closed. The temperature of the autoclave was returned to room temperature, the outer surface was sufficiently dried, and the weight of the autoclave was measured. The amount of $NH_3$ packed was confirmed by the value in a mass flow meter, and the rate of packing was adjusted to 33%.

Subsequently, the autoclave was accommodated in an electric furnace configured from a heater divided into halves up and down. The temperature was raised so that the temperature of the raw material dissolution region 1 on the outer surface of the autoclave was 562.5° C. and the temperature of the crystal growth region 2 was 586.4° C. (temperature difference 23.9° C.), and, after reached the set temperature, was retained at that temperature for 6 days. The pressure in the autoclave was 114 MPa. The variation in outer surface control temperature in the autoclave during retention was ±0.5° C. or less.

Thereafter, the valve attached in the autoclave was released, and $NH_3$ in the autoclave was removed. Natural cooling was carried out until the temperature of the outer surface of the autoclave was returned to room temperature. Thereafter, the lid of the autoclave was opened. The interior of the autoclave was confirmed, and a gallium nitride crystal was then found to be uniformly precipitated on the entire seed crystal plane of a rectangle of 5×15 mm. The N-plane growth rate was 189 μm/day and the thickness of the GaN crystal grown on the N-plane was 1.0 mm. The impurity concentrations in the N-plane growth region (position at a distance of about 800 μm from the seed crystal surface of the GaN crystal obtained) of the present crystal were subjected to SIMS analysis, and as a result, the fluorine concentration was $1.5\times10^{17}$ atoms/cm$^3$, the oxygen concentration was $8.0\times10^{17}$ atoms/cm$^3$, the hydrogen concentration was $9.3\times10^{17}$ atoms/cm$^3$, the carbon concentration was less than $3.0\times10^{14}$ atoms/cm$^3$ (detection limit), the nickel concentration was $4.5\times10^{15}$ atoms/cm$^3$, the iron concentration was $1.7\times10^{15}$ atoms/cm$^3$, and the chromium concentration was less than $5.0\times10^{13}$ atoms/cm$^3$ (detection limit). The dislocation density of the GaN crystal obtained was in the order of $10^3$ to the order of $10^4$, and the dislocation density of the GaN crystal in each of Examples 2 to 4 and Comparative Examples 1 to 3 below was also in the same order.

Figure 2:
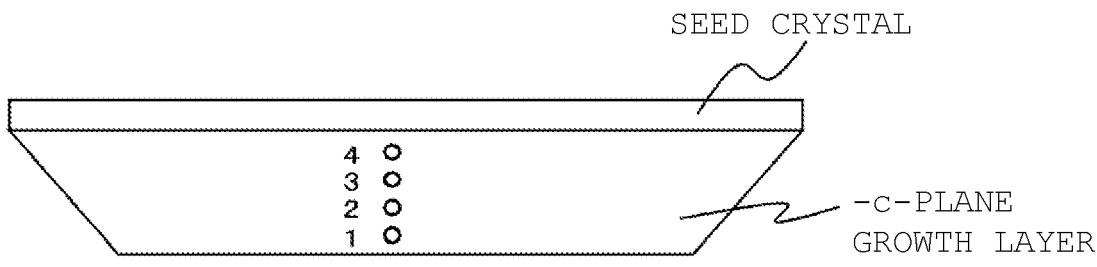
FIG. 2 is a schematic view for describing a measurement position in PL lifetime measurement with a GaN crystal according to Example 1.

The respective PL lifetimes at positions of 850 μm (1 in FIG. 2), 600 μm (2 in FIG. 2), 400 μm (3 in FIG. 2), and 150 μm (4 in FIG. 2) from the seed crystal surface of the GaN crystal obtained, as illustrated in FIG. 2, were measured, and were respectively 40 ps, 29 ps, 17 ps, and 2 ps. The PL lifetime at the outermost surface portion on the extended line of these measurement positions was 38 ps.

Figure 4:
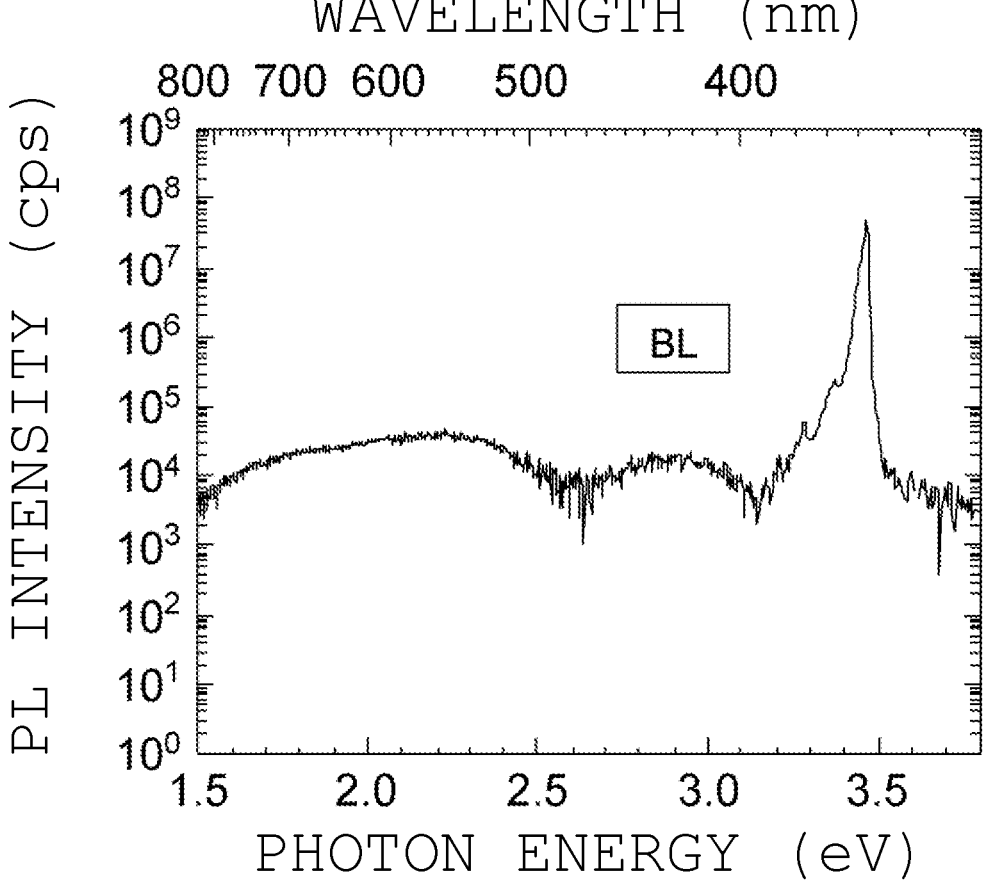
FIG. 4 is a graph representing PL lifetime measurement results with a GaN crystal according to Example 1.

A surface grown, on the N-plane of the GaN crystal obtained, was subjected to photoluminescence (PL) measurement at 12 K, and the results were illustrated in FIG. 4. A broad peak was found around 2.9 eV, and the presence of a blue luminescence band was identified. The intensity ratio (BL/NBE) of the blue luminescence band (BL) to the band-edge luminescence (NBE) observed at a luminescence wavelength of 400 to 470 nm, of the GaN crystal obtained, was 0.006. Here, PL measurement was performed with excitation by He—Cd laser of a wavelength of 325 nm and an output of 38 W/cm$^2$.

The FWHMs in the 004 diffraction X-ray rocking curve at a measurement point were 18 arcsec (a-axis direction) and 19 arcsec (m-axis direction).

The FWHMs in the 002 diffraction X-ray rocking curve at a measurement point were 19 arcsec (a-axis direction) and 19 arcsec (m-axis direction). The FWHM in the 102 diffraction X-ray rocking curve was 10 arcsec (a-axis direction). The $\Delta\omega$ in the 002 diffraction X-ray rocking curve was less than ±0.004°. The curvature radius was 151 m.

Example 2

A GaN crystal was produced in the same manner as in Example 1 except that the temperature was raised so that the temperature in the raw material dissolution region and the temperature in the crystal growth region on the outer surface of the autoclave were respectively 562.6° C. and 585.8° C. (temperature difference 23.2° C.), and, after reached the set temperature, was retained at that temperature for 14 days, and the pressure in the autoclave was 115 MPa, in the crystal growth conditions.

The N-plane growth rate was 160 μm/day and the thickness of the GaN crystal grown on the N-plane was 2.2 mm.

Figure 3:
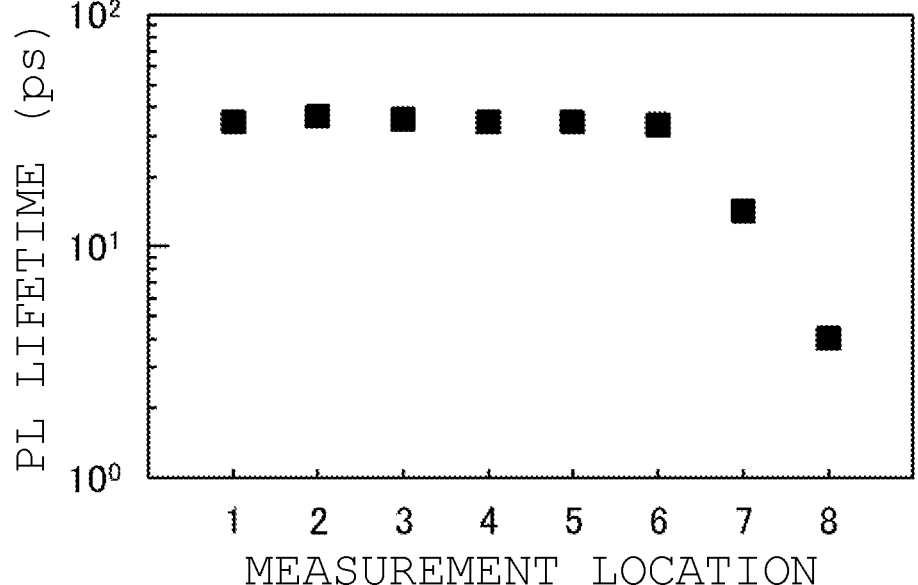
FIG. 3 is a graph representing PL lifetime measurement results with a GaN crystal according to Example 2.

The respective PL lifetimes at positions of 2100 μm (measurement location 1), 1800 μm (measurement location 2), 1500 μm (measurement location 3), 1250 μm (measurement location 4), 1000 μm (measurement location 5), 700 μm (measurement location 6), 400 μm (measurement location 7), and 150 μm (measurement location 8) from the seed crystal surface of the GaN crystal obtained were measured, and were respectively 34 ps, 36 ps, 35 ps, 34 ps, 34 ps, 33 ps, 14 ps, and 4 ps. The results are represented in FIG. 3.

The FWHMs in the 002 diffraction X-ray rocking curve at a measurement point were 18 arcsec (a-axis direction) and 19 arcsec (m-axis direction). The FWHM in the 102 diffraction X-ray rocking curve was 9 arcsec (a-axis direction). The $\Delta\omega$ in the 002 diffraction X-ray rocking curve was less than ±0.005°. The curvature radius was 93 m.

Example 3

A GaN crystal was produced in the same manner as in Example 1 except that the temperature was raised so that the temperature in the raw material dissolution region and the temperature in the crystal growth region on the outer surface of the autoclave were respectively 571.8° C. and 575.2° C. (temperature difference 3.4° C.), and, after reached the set temperature, was retained at that temperature for 6 days, and the pressure in the autoclave was 114 MPa, in the crystal growth conditions.

The N-plane growth rate was 73 μm/day and the thickness of the GaN crystal grown on the N-plane was 0.5 mm. The impurity concentrations in the N-plane growth region (position at a distance of 850 μm from the seed crystal surface of the GaN crystal obtained) of the present crystal were subjected to SIMS analysis, and as a result, the fluorine concentration was $4.8\times10^{16}$ atoms/cm$^3$, the oxygen concentration was $4.1\times10^{18}$ atoms/cm$^3$, the hydrogen concentration was $2.4\times10^{18}$ atoms/cm$^3$, the carbon concentration was less than $3.0\times10^{14}$ atoms/cm$^3$ (detection limit), the nickel concentration was $3.9\times10^{15}$ atoms/cm$^3$, the iron concentration was $1.3\times10^{15}$ atoms/cm$^3$, and the chromium concentration was less than $5.0\times10^{13}$ atoms/cm$^3$ (detection limit).

The respective PL lifetimes at positions of 450 μm, 250 μm, and 100 μm from the seed crystal surface of the GaN crystal obtained were measured, and were respectively 8 ps, 5 ps, and 3 ps.

The PL lifetime at the outermost surface portion on the extended line of these measurement positions was 10 ps.

The FWHMs in the 004 diffraction X-ray rocking curve at a measurement point were 16 arcsec (a-axis direction) and 16 arcsec (m-axis direction).

The FWHMs in the 002 diffraction X-ray rocking curve at a measurement point were 18 arcsec (a-axis direction) and 19 arcsec (m-axis direction). The FWHM in the 102 diffraction X-ray rocking curve was 9 arcsec (a-axis direction). The $\Delta\omega$ in the 002 diffraction X-ray rocking curve was less than ±0.003°. The curvature radius was 485 m.

Example 4

A GaN crystal was produced in the same manner as in Example 1 except that the temperature was raised so that the temperature in the raw material dissolution region and the temperature in the crystal growth region on the outer surface of the autoclave were respectively 581.5° C. and 587.8° C. (temperature difference 6.3° C.), and, after reached the set temperature, was retained at that temperature for 6 days, and the pressure in the autoclave was 114.5 MPa, in the crystal growth conditions.

The N-plane growth rate was 202 μm/day and the thickness of the GaN crystal grown on the N-plane was 1.1 mm. The impurity concentrations in the N-plane growth region (position at a distance of 200 μm from the seed crystal surface of the GaN crystal obtained) of the present crystal were subjected to SIMS analysis, and as a result, the fluorine concentration was $4.5\times10^1$ atoms/cm$^3$, the oxygen concentration was $1.9\times10^{18}$ atoms/cm$^3$, the hydrogen concentration was $1.3\times10^{18}$ atoms/cm$^3$, the carbon concentration was $3.0\times10^{15}$ atoms/cm$^3$, the nickel concentration was $4.3\times10^{15}$ atoms/cm$^3$, the iron concentration was $3.9\times10^{15}$ atoms/cm$^3$, the chromium concentration was less than $1.0\times10^{14}$ atoms/cm$^3$ (detection limit), the silicon concentration was less than $6.0\times10^{13}$ atoms/cm$^3$, and the silver concentration was less than $1.0\times10^{15}$ atoms/cm$^3$ (detection limit).

The respective PL lifetimes at positions of 1050 μm, 800 μm, 600 μm, 400 μm, and 150 μm from the seed crystal surface of the GaN crystal obtained were measured, and were respectively 14 ps, 12 ps, 7 ps, 3 ps, and 2 ps. The PL lifetime at the outermost surface portion on the extended line of these measurement positions was 15 ps.

The FWHMs in the 004 diffraction X-ray rocking curve at a measurement point were 16 arcsec (a-axis direction) and 20 arcsec (m-axis direction).

The FWHMs in the 002 diffraction X-ray rocking curve at a measurement point were 18 arcsec (a-axis direction) and 20 arcsec (m-axis direction). The FWHM in the 102 diffraction X-ray rocking curve was 8 arcsec (a-axis direction). The $\Delta\omega$ in the 002 diffraction X-ray rocking curve was less than ±0.003°. The curvature radius was 105 m.

Comparative Example 1

An autoclave (ratio of volume to inner surface area: 1.2 (cm)) made of a Ni—Fe-based alloy, with an Ag lining provided, as a reaction vessel, was used as a pressure-resistant vessel, and NH$_4$F having a purity of 99.9% or more was added as a mineralizer so as to be in an amount of 1.25% by mol relative to ammonia packed. A GaN crystal was produced in the same manner as in Example 1 except that the temperature was raised so that the temperature in the raw material dissolution region and the temperature in the crystal growth region on the outer surface of the autoclave were respectively 640° C. and 660° C. (temperature difference 20° C.), and, after reached the set temperature, was retained at that temperature for 10 days, and the pressure in the autoclave was 117.4 MPa, in the crystal growth conditions.

The N-plane growth rate was 120 μm/day and the thickness of the GaN crystal grown on the N-plane was 1.2 mm.

The PL lifetime at a position of 1000 μm from the seed crystal surface of the GaN crystal obtained was measured, and was 4 ps.

Comparative Example 2

A capsule made of a platinum alloy was placed in an autoclave made of a Ni—Fe-based alloy, as a reaction vessel, and the present capsule was used as a reaction vessel, to perform crystal growth. The ratio of the volume to the inner surface area in the capsule was 1.3 cm. A GaN crystal was produced in the same manner as in Example 1 except that $NH_4F$ (concentration relative to ammonia packed: 3% by mol) having a purity of 99.9% or more and $NH_4I$ (concentration relative to ammonia packed: 2% by mol) having a purity of 99.99% or more were used in a mineralizer, and the temperature was raised so that the temperature in the raw material dissolution region and the temperature in the crystal growth region on the outer surface of the autoclave were respectively 607° C. and 617° C. (temperature The impurity concentrations in the N-plane growth region (position at a distance of 2300 μm from the seed crystal surface of the GaN crystal obtained) of the present crystal were subjected to SIMS analysis, and as a result, the fluorine concentration was $1.3\times10^{16}$ atoms/cm$^3$, the oxygen concentration was $1.6\times10^{18}$ atoms/cm$^3$, the hydrogen concentration was $9.0\times10^{17}$ atoms/cm$^3$, the carbon concentration was $2.9\times10^{14}$ atoms/cm$^3$ and comparable with the detection limit, the nickel concentration was $6.0\times10^{16}$ atoms/cm$^3$, the iron concentration was $1.5\times10^{16}$ atoms/cm$^3$, and the chromium concentration was $8.0\times10^{13}$ atoms/cm$^3$.

The conditions and characteristics of the GaN crystal obtained in each of Examples and Comparative Examples were summarized in Table 1 below. In Table 1 below, the "Maximum PL lifetime" means the maximum PL lifetime among those measured in Examples and Comparative Examples. In Table 1, the designation "-" means no measurement.

TABLE 1

| | | Example 1 | Example 2 | Example 3 | Example 4 | Comparative Example 1 | Comparative Example 2 | Reference Example |
|---|---|---|---|---|---|---|---|---|
| Mineralizer | | $NH_4F$ | $NH_4F$ | $NH_4F$ | $NH_4F$ | $NH_4F$ | $NH_4F + NH_4I$ | $NH_4F$ |
| Ratio of volume to inner surface area in reaction vessel | cm | 2.3 | 2.3 | 2.3 | 2.3 | 1.2 | 1.3 | 1.2 |
| Pressure | MPa | 114 | 115 | 114 | 114.5 | 117.4 | 200 | 123.8 |
| N-plane growth rate | μm/day | 184 | 160 | 73 | 202 | 120 | 100 | 300 |
| Element concentration (N-plane) F | atoms/cm$^3$ | $1.5 \times 10^{17}$ | — | $4.8 \times 10^{16}$ | $4.5 \times 10^{16}$ | — | — | $1.3 \times 10^{16}$ |
| O | atoms/cm$^3$ | $8.0 \times 10^{17}$ | — | $4.1 \times 10^{18}$ | $1.9 \times 10^{18}$ | — | — | $1.6 \times 10^{18}$ |
| H | atoms/cm$^3$ | $9.3 \times 10^{17}$ | — | $2.4 \times 10^{18}$ | $1.3 \times 10^{18}$ | — | — | $9.0 \times 10^{17}$ |
| C | atoms/cm$^3$ | less than $3.0 \times 10^{14}$ | — | less than $3.0 \times 10^{14}$ | $3.0 \times 10^{15}$ | — | — | $2.9 \times 10^{14}$ |
| Ni | atoms/cm$^3$ | $4.5 \times 10^{15}$ | — | $3.9 \times 10^{15}$ | $4.3 \times 10^{15}$ | — | — | $6.0 \times 10^{16}$ |
| Fe | atoms/cm$^3$ | $1.7 \times 10^{15}$ | — | $1.3 \times 10^{15}$ | $3.9 \times 10^{15}$ | — | — | $1.5 \times 10^{16}$ |
| Cr | atoms/cm$^3$ | less than $5.0 \times 10^{13}$ | — | less than $5.0 \times 10^{13}$ | less than $1.0 \times 10^{14}$ | — | — | $8.0 \times 10^{13}$ |
| Maximum PL lifetime | ps | 40 | 36 | 8 | 14 | 4 | 2 | — | difference 10° C.), and, after reached the set temperature, was retained at that temperature for 33 days, and the pressure in the autoclave was 200 MPa, in the crystal growth conditions.

The N-plane growth rate was 100 μm/day and the thickness of the GaN crystal grown on the N-plane was 3.3 mm.

The PL lifetime at a position of 900 μm from the seed crystal surface of the GaN crystal obtained was measured, and was 2 ps.

Reference Example

The same reaction vessel (ratio of volume to inner surface area: 1.2 cm) as in Comparative Example 1 was used as a pressure-resistant vessel, and $NH_4F$ having a purity of 99.9% or more was added as a mineralizer at a concentration of 2.5% by mol relative to ammonia packed. A GaN crystal was produced in the same manner as in Example 1 except that the temperature in the raw material dissolution region and the temperature in the crystal growth region on the outer surface of the autoclave were respectively 560° C. and 610° C. (temperature difference 50° C.), and, after reached the set temperature, was retained at that temperature for 10 days, and the pressure in the autoclave was 123.8 MPa, in the crystal growth conditions.

The N-plane growth rate was 300 μm/day and the thickness of the GaN crystal grown on the N-plane was 2.6 mm.

It has been found from Table 1 above that a GaN crystal having a PL lifetime of 5 ps or more can be obtained by an increase in ratio of the volume to the inner surface area in the reaction vessel and a reduction in pressure in crystal growth.

INDUSTRIAL APPLICABILITY

A production method according to an embodiment of the present invention can produce a GaN crystal having a PL lifetime of 5 ps or more and 200 ps or less. A production method according to an embodiment of the present invention can also allow for suppression of energy cost. A GaN crystal efficiently produced by a production method according to an embodiment of the present invention can be widely applied in a GaN substrate for not only a blue light-emitting diode (LED) or blue semiconductor laser (LD) including a nitride semiconductor of an element in Group 13 in the periodic table, but also a power semiconductor element (power device) or a high-frequency power device. Therefore, the present invention is extremely high in industrial applicability.

DESCRIPTION OF SYMBOLS 1 upper portion (raw material dissolution region)
2 lower portion (crystal growth region)
3 outer wall

4 raw material
5 baffle plate
6 seed crystal

What is claimed is:

1. A gallium nitride crystal having a light emission lifetime by time-resolved photoluminescence measurement, of 5 ps or more and 200 ps or less, and satisfying at least one of the following requirement (i) and requirement (ii):

(i) an FWHM in a 004 diffraction X-ray rocking curve is 50 arcsec or less at least one position of the crystal; and (ii) a dislocation density is $5\times10^6$ cm$^{-2}$ or less.

2. The gallium nitride crystal according to claim 1, wherein the dislocation density is less than $1\times10^6$ cm$^{-2}$.

3. The gallium nitride crystal according to claim 1, wherein a hydrogen concentration is $2\times10^{19}$ atoms/cm$^3$ or less.

4. The gallium nitride crystal according to claim 1, wherein an oxygen concentration is $2\times10^{19}$ atoms/cm$^3$ or less.

5. A gallium nitride substrate obtained by slicing the gallium nitride crystal according to claim 1.

6. A method for producing a gallium nitride substrate, the method comprising a step of performing selection so as to cut out a region where a light emission lifetime by time-resolved photoluminescence measurement is 5 ps or more and 200 ps or less, and slicing the gallium nitride crystal according to claim 1.

7. A gallium nitride substrate obtained by the production method according to claim 6, wherein the light emission lifetime by time-resolved photoluminescence measurement is 5 ps or more and 200 ps or less in a region corresponding to 90% or more of a surface of the substrate.

8. The gallium nitride substrate according to claim 7, wherein a difference in light emission lifetime at each measurement point is 30 ps or less in time-resolved photoluminescence measurement of a main surface of the substrate at two or more different points.

9. The gallium nitride substrate according to claim 7, having at least two points where a difference in light emission lifetime at each measurement point is 1 ps or more in time-resolved photoluminescence measurement of a main surface of the substrate.

10. A method for producing a gallium nitride substrate, the method comprising a step of growing a gallium nitride crystal having a thickness of 500 μm or more on a gallium nitride seed, by an ammonothermal method, and cutting out the gallium nitride crystal grown, to a plate shape, to produce a gallium nitride substrate, wherein the gallium nitride substrate has a light emission lifetime by time-resolved photoluminescence measurement, of 5 ps or more and 200 ps or less.

* * * * *